(12) United States Patent
Kruse

(10) Patent No.: US 7,542,032 B2
(45) Date of Patent: Jun. 2, 2009

(54) VIRTUAL PAINTING SYSTEM AND PAINT SPRAY GUN

(75) Inventor: Albrecht Kruse, Stuttgart (DE)

(73) Assignee: Sata GmbH & Co. KG, Kornwestheim (DE)

( * ) Notice: Subject to any disclaimer, the term of this patent is extended or adjusted under 35 U.S.C. 154(b) by 92 days.

(21) Appl. No.: 11/224,721

(22) Filed: Sep. 12, 2005

(65) Prior Publication Data

US 2006/0171771 A1    Aug. 3, 2006

(30) Foreign Application Priority Data

Feb. 2, 2005    (DE) .................. 20 2005 001 702 U

(51) Int. Cl.
*G06T 11/00* (2006.01)
(52) U.S. Cl. .................. 345/418; 345/156; 434/84
(58) Field of Classification Search .................. None
See application file for complete search history.

(56) References Cited

U.S. PATENT DOCUMENTS

| | | | | |
|---|---|---|---|---|
| 5,102,045 A | * | 4/1992 | Diana .............................. | 239/3 |
| 5,289,974 A | * | 3/1994 | Grime et al. ................... | 239/72 |
| 5,325,473 A | * | 6/1994 | Monroe et al. ............... | 345/581 |
| 5,592,597 A | * | 1/1997 | Kiss ............................ | 345/419 |
| 5,951,296 A | * | 9/1999 | Klein ........................... | 434/84 |
| 6,717,584 B2 | * | 4/2004 | Kulczycka ................... | 345/589 |
| 6,801,211 B2 | * | 10/2004 | Forsline et al. .............. | 345/581 |
| 6,963,331 B1 | * | 11/2005 | Kobayashi et al. .......... | 345/158 |
| 7,106,343 B1 | * | 9/2006 | Hickman ..................... | 345/589 |
| 2003/0218596 A1 | * | 11/2003 | Eschler ........................ | 345/156 |
| 2004/0233223 A1 | * | 11/2004 | Schkolne et al. ............ | 345/621 |
| 2006/0007123 A1 | * | 1/2006 | Wilson et al. ............... | 345/156 |

FOREIGN PATENT DOCUMENTS

WO        WO 92/07346        4/1992

* cited by examiner

*Primary Examiner*—Ulka Chauhan
*Assistant Examiner*—Andrew Yang
(74) *Attorney, Agent, or Firm*—Martin Fleit; Paul D. Bianco; Fleit Gibbons Gutman Bongini & Bianco PL

(57) ABSTRACT

The invention concerns a virtual painting system for simulating a paint application process and the resulting application of paint to a surface. The system includes a virtual paint applicator device, a position detector to detect the spatial position of the paint applicator device with respect to the surface to be painted, a data processing unit and a display device, wherein the position data of the paint applicator device are routed to the data processing unit, where they are converted into video data for rendering the virtual paint application visible, and which are further routed to the display device, in order to show a visual image of the virtual paint application process on the surface to be painted. This painting system makes possible a quick and, at the same time, realistic virtual representation of painting with a paint spray gun.

20 Claims, 1 Drawing Sheet

VIRTUAL PAINTING SYSTEM AND PAINT SPRAY GUN

FIELD OF THE INVENTION

The invention concerns a virtual painting system, more specifically to a virtual painting system for simulating a paint application process and the resulting application of paint to a surface.

BACKGROUND OF THE INVENTION

In the field of painting of surfaces with paint spray guns, it is desirable to consume the least amount of paint, cleaning agent, and painting sample objects during the training of personnel to use the paint spray gun. Thus, the training of painters is done conventionally by the actual painting of various objects, so that the painting is repeated several times for training purposes. The drawback here is that much paint and enamel and cleaning agents are consumed and the painted objects become unusable after several applications of paint, so that they must be disposed of.

Moreover, when preparing paint samples and design proposals for painting tasks, it is desirable to be able to test various paint treatments in a quick, easy, and realistic way. For this purpose, the prior art offers two possibilities, namely, the preparation of actual sample paint treatments or the simulation of a paint treatment by means of a computer-aided drawing and painting software.

The conventional means of preparing sample paint treatments consists of applying the desired paint treatments with an actual paint spray gun onto the surfaces of actual objects, which naturally achieves the original representation of the different coat of paints. The drawback here is that a sample piece must be prepared for each coat of paint, so as to compare the different coats of paint to each other. Especially when the objects to be painted are large and costly, this method is costly and cumbersome. The painting process itself is costly and time-consuming, since the surfaces of the objects first must be prepared for the painting, and the paint or enamel must dry after each coat of paint. It is difficult, if not impossible, to correct mistakes during the painting. Furthermore, paint, enamel, and environmentally harmful cleaning agents are consumed during these sample paint treatments. After selecting the desired paint treatment, the painted objects are destroyed or, if destined for recycling, the paint must be removed from them in a costly manner, thereby entailing the use of cleaning agents that are harmful to human health and the environment.

In an alternative possibility, the desired spray painting can be simulated with computer-assisted painting and drawing software on a conventional data processing system. For this purpose, the simulation of the painting or enameling task is done with conventional computer input devices, such as a computer mouse or computer drawing pen, and the display appears on the monitor of the data processing system. The colors and shapes of the painting or enameling task are set by software in the drawing and painting program, so that the visual display of the painting will appear as close as possible to an actual painting task using a manually operated paint spray gun. The drawback of this computer-assisted simulation of the manual paint application is that the conventional computer input devices-can only inadequately simulate the handling and operation of an actual paint spray gun, so that the simulation of the painting task as displayed on the monitor screen can only inadequately simulate the effects achieved during an actual painting task with an actual paint spray gun. Some effects cannot even be simulated at all in this way, such as bringing the paint spray jet closer to or further away from the surface to be painted.

SUMMARY OF THE INVENTION

The problem of the present invention is therefore to provide a painting system as well as a paint spray gun that enable a fast, resource-, health- and environment-sparing and, at the same time realistic representation of a painting process using a paint spray gun.

This problem is solved by a painting system as set forth in the claims as well as a paint applicator device as also set forth in the claims. Advantageous embodiments of the painting system and the paint applicator device will be found in the dependent claims.

With the virtual painting system and the paint applicator device of the invention it is possible to detect the spatial position of the paint applicator device with respect to the paint application surface and transmit this data to a data processing unit, and to convert the data, using the detected parameters such as distance and speed, and possibly other settings of the spray jet, into video data in the data processing unit and display them on a display device for the depiction of the virtual paint application. In this way, the virtual painting task with the paint applicator device can be depicted on the display device in a realistic manner and in real time.

Another major benefit of the painting system and the paint applicator device of the invention is that the spray parameters which can be set for the paint applicator device, such as the spray nozzle used or the air pressure for the painting task, can be set in a conventional manner and detected by a setting device arranged on the paint applicator and transmitted to the data processing unit. Moreover, it is advantageous if a color selection device makes it possible to change the properties of the paint or enamel being sprayed by the paint applicator device directly on the paint applicator device.

BRIEF DESCRIPTION OF THE DRAWING

Additional features and benefits of the invention will emerge from the following description of a preferred embodiment by means of the following drawing, which shows a virtual painting system with a data processing unit 7, a virtual paint applicator device 1, a position detection 5, 6 and a display device.

DETAILED DESCRIPTION OF THE INVENTION

Figure 1:
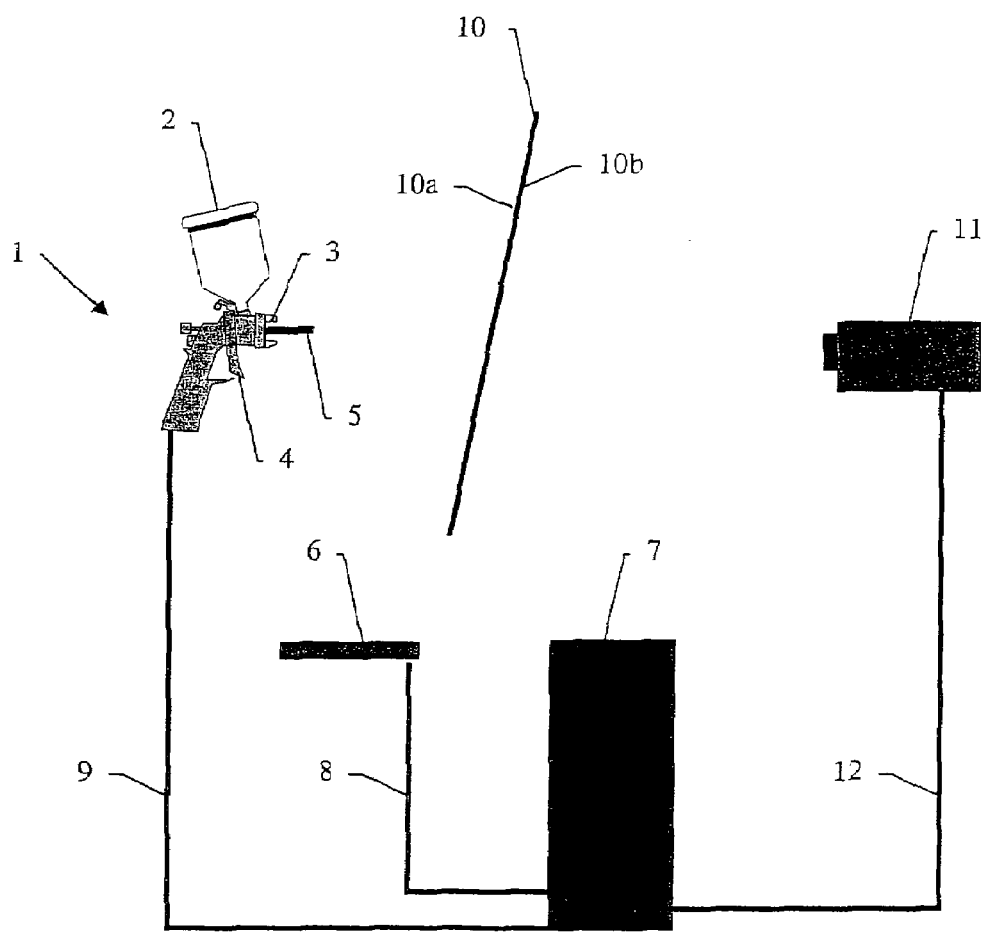

The virtual paint applicator device in the embodiment shown here is formed by a known paint spray gun 1 with a spray channel through which the paint or enamel located in a reservoir 2 arranged on the paint spray gun is sprayed via a nozzle 3 onto the surface being painted during the actual paint spraying. The quantity of compressed air flowing through the spray channel is controlled by setting a micrometer on the paint spray gun 1 and the position of a trigger 4, which is manipulated by the user of the paint spray gun 1. Instead of the paint spray gun 1, other devices can also be used to simulate application of paint. The virtual paint spray gun 1 need only simulate an actual paint spray gun as much as possible, especially in terms of its size, geometry, weight, etc.

In order to employ the paint spray gun 1 in the virtual painting system of the invention for the simulation of an actual paint application process and the resulting painting without actual paint application, and to depict as realistically as possible and in real time the performed paint application with the paint spray gun 1 on a projection disk 10, the position of the trigger 4 and the position and motion of the paint spray gun 1 relative to the projection disk 10 are detected and transmitted to the data processing unit 7 for calculation of the video data for the visual representation of the virtual paint application process on the projection disk 10. For this purpose, the paint spray gun 1 is configured as described hereafter.

In order to detect the position of the trigger 4, a trigger indicator is arranged on the paint spray gun 1. It detects whether the trigger 4 is activated, and furthermore it preferably detects the precise position of the trigger 4, so that not only the settings "spray channel fully open" and "spray channel closed," but also intermediate positions can be detected.

In order to detect the position and movement of the paint spray gun 1 relative to the projection disk 10, the position detection 5, 6 has a cylindrical ultrasound receiver 5, which is arranged at the outlet opening of the spray nozzle 3 and whose longitudinal axis coincides with the direction of the paint spray that emerges when the paint spray gun 1 is used in the conventional manner.

The position detection 5, 6 also comprises an ultrasound emitter 6, arranged stationary relative to the projection disk 10, which sends position signals to the ultrasound receiver 5. The ultrasound emitter 6 is connected by a first data line 8 to the data processing unit 7 and is actuated by the latter to send position signals to the ultrasound receiver 5.

Instead of arranging the ultrasound receiver 5 on the paint spray gun 1 and the ultrasound emitter 6 on the data processing unit 7, one can also arrange the ultrasound emitter 6 on the paint spray gun 1 and the ultrasound receiver 5 on the data processing unit 7. In this case as well, the ultrasound emitter 6 is connected to the data processing unit 7. It is also possible to use signal techniques other than ultrasound, such as infrared or radio signals.

Using the control data sent by the data processing unit 7 to the ultrasound emitter 6 and the position signals received from the ultrasound receiver 5, the data processing unit 7 computes the precise spatial position of the paint spray gun 1 relative to the projection disk 10. In addition, the data processing unit 7 can compute the motion of the paint spray gun 1 in space from the position data, as well as the corresponding time data memorized in the data processing unit 7.

For this purpose, one can use a device for three-dimensional position detection, such as that disclosed in WO 92/07346.

By a second data line 9 between paint spray gun 1 and data processing unit 7, which can also be configured as a wireless radio or infrared data transmission, the trigger indicator arranged on the paint spray gun 1 transmits the position of the trigger 4 to the data processing unit 7.

The second data line 9 is also used to relay the paint application parameters which have been set on the setting device of the paint spray gun 1, such as the spray pressure, geometry of the paint spray, and the color settings which have been set on the color selection device of the paint spray gun 1, to the data processing unit 7, where they are used to calculate the video data. The spray paint and the paint application data can also be set, in an alternative embodiment not shown here, on the display device or the data processing unit 7, for example, by means of keyboard entry or a touch screen.

The display device comprises a projection apparatus 11 and a projection disk 10, whose front end facing the paint spray gun 1 serves as the paint application surface 10a for the virtual painting by means of the paint spray gun 1. The projection disk 10 is designed as a back projection disk, so that an image projected from behind onto the projection disk 10 is visible on its front end, i.e., the paint application surface 10a. The projection apparatus 11 is connected via a third data line 12 to the data processing unit 7, in order to use the video data calculated by the latter to project a representation of the virtual paint application onto the back side 10b of the projection disk 10 in real time. Instead of the projection disk 10 and the projection apparatus 1-1 shown here, another means of display can also be used, such as a high-resolution, wide-area monitor, whose display surface then represents the virtually painted surface 10a.

The virtual application of paint with the spray gun 1 on the surface to be painted 10a occurs as follows: the spray gun 1 user sets the necessary spray parameters on the spray gun 1, as in the case of an actual painting task, such as the spray pressure or the geometry of the spray jet. He then carries out the virtual paint spraying on the surface to be painted 10a, making use of the paint spray gun 1 as in an actual painting job.

In order to see at once the outcome of his virtual spraying on the projection disk 10, data relayed from the paint spray gun 1 to the data processing unit 7, i.e., the spatial position of the paint spray gun 1 relative to the projection disk 10, position of the trigger 4, as well as the paint selected at the paint spray gun 1 and the spray parameters, are used to calculate in the data processing unit 7 the visual representation of the application of paint to the front end of the projection disk 10 in real time, corresponding to the actual painting job. For this purpose, reference data records are kept in a data memory of the data processing unit 7, containing reference video data for different sets of spray parameters for the virtual paint applicator device 1. These reference data records have been recorded by actual paint application processes, maintaining the parameters which are stored along with the reference data records. Calculation of the video data of the virtual paint application process is done by comparing the spray parameters detected during the virtual paint application process or the presettings in the data processing unit 7 to the reference data records kept in the data processing unit 7. Insofar as intermediate values of spray parameters are detected or have been set for the virtual paint application process, an interpolation (mathematical model) is carried out between the stored reference data records in order to ascertain the virtual paint image of the virtual paint application process.

The data processing unit 7 then relays the calculated video data via the third data line 12 to the projection apparatus 11, which projects the representation of the paint application onto the back side 10b of the back projection disk 10 in real time.

Thus, the user of the paint spray gun 1 immediately sees the very realistic outcome of his virtual application of paint on the front side of the back projection disk 10.

The virtual painting system of the invention and the paint applicator device of the invention, especially in its embodiment as a paint spray gun, make it possible to train painters in the use of paint application devices without wasting paint, enamel, cleaning agents or painted objects. The virtual paint spray process can also be interrupted at any time, since the virtual paint application is merely stored in the data processing unit 7 and the interrupted paint spray process can be continued later by simply loading the memorized data once again.

Moreover, one can experiment with painting and make corrections in a realistic manner, without the needless waste of paint, enamel or painted objects. The painter can also paint in the usual manner by using an actual paint spray gun, so that the outcome of the virtual painting process comes extremely close to reality. All effects which are achievable by the manual operation of the paint spray gun can therefore be carried out and be appropriately simulated and displayed in the display device. Furthermore, the painter can evaluate and be shown deviations from the ideal values, such as the ideal spray distance and spray angle, which have an influence on the painted surfaces.

The invention claimed is:

1. A virtual painting system for simulating a paint application process, the virtual paint system comprising:
    an electronic device, wherein the electronic device substantially resembles a physical paint applicator device, and wherein the electronic device is configured to train a user how to properly use the physical paint applicator device by causing virtual paint being applied on a virtual surface being painted to be displayed on a display device through a virtual paint application process in response to the user interacting with the electronic device,
    an electronic position detector to detect spray parameters including a three-dimensional spatial position, a distance, and a speed of the electronic device with respect to the virtual surface to be painted,
    a data processing unit, wherein data of the spray parameters of the electronic device is routed to the data processing unit and transformed there into video data, to display a visual image of the virtual paint being applied on the virtual surface being painted, and
    wherein reference data records that contain reference video data for different sets of spray parameters of the electronic device are accessible by the data processing unit, these reference data records having been recorded by actual paint application processes, wherein the actual paint application processes include physically applying real paint using the physical paint applicator device to at least one physical item to be painted and recording spray parameters associated with a physical paint spraying device including a three-dimensional spatial position, a distance and a speed as the physical paint spraying device is applying real paint to the physical item and recording the spray parameters associated with applying the real paint using a set of different spray settings on the physical paint spraying device,
    wherein the video data is calculated by comparison and interpolation of at least one of spray parameters detected during the virtual paint application process against the reference data records accessible by the data processing unit.

2. The virtual panting system of claim 1, wherein the electronic device is a paint spray gun.

3. The virtual painting of claim 1, wherein the electronic position detection has a position transmitter, connected stationary to the data processing unit, for sending position signals, and a position receiver, connected to the electronic device, for receiving the position data.

4. The virtual painting of claim 1, wherein the display device has a projection apparatus for projecting the video data onto the surface to be painted.

5. The virtual painting of claim 1, wherein the surface to be paint is a front end of a back projection disk.

6. The virtual painting of claim 1, wherein the at least one of paint color and the spray parameters of the electronic device can be set in the data processing unit and are used when calculating the video data.

7. The virtual painting of claim 6, wherein the data processing unit is designed to calculate the video data from the three-dimensional spatial position of the electronic device, the position of a trigger of the electronic device and at least one setting for paint color and the spray parameters.

8. A virtual painting system for simulating a paint application process, the virtual painting system comprising:
    an electronic device, wherein the electronic device substantially resembles a physical paint applicator device, and wherein the electronic device is configured to train a user how to properly use the physical paint applicator device by causing virtual paint being applied to a virtual surface to be displayed on a display device through a virtual paint application process in response to the user interacting with the electronic device, wherein the electronic device includes at least a trigger for staffing and stopping a simulated flow of virtual paint from the electronic device and for controlling a simulated flow rate of the virtual paint from the electronic device, and wherein the trigger is adapted to move from a first position to a second position and a plurality of positions there between, wherein each of the first position, second position, and plurality of positions is associated with a separate and distinct flow rate;
    at least one electronic position detector adapted to detect spray parameters of a three-dimensional spatial position, a distance, and a speed of the electronic device with respect to the virtual surface being painted and for detecting a current position of the trigger; and
    a data processing unit, wherein the position data of the electronic device and the trigger are routed to the data processing unit and transformed there into video data, to display a visual image of the virtual paint application process on the virtual surface being painted, wherein the virtual paint application process is visualized based on reference data records that comprise reference video data for different sets of spray parameters of the electronic device, these reference data records having been recorded by actual paint application processes, wherein the actual paint application processes include physically applying real paint using the physical paint applicator to a surface of at least one physical item and recording parameters associated with a paint spraying device including at least distance and speed as the paint spraying device is applying real paint to the at least one physical item and recording parameters associated with applying the real paint using a set of different spray settings on the physical paint applicator, and wherein the data processing unit dynamically adjusts the simulated flow rate based on a flow rate associated with the current position of the trigger indicated by the position data of the trigger and at least one of the data reference records.

9. The virtual painting system of claim 8, wherein the electronic device is a paint spray gun.

10. The virtual painting system of claim 8, wherein the position detector has a position transmitter, connected stationary to the data processing unit, for sending at least one position signal, and a position receiver, connected to the electronic device, for receiving the at least one position signal.

11. The virtual painting system of claim 8, wherein the display device has a projection apparatus for projecting the video data onto the surface to be painted.

12. The virtual painting system of claim 8, wherein the surface to be painted is a front end of a back projection disk.

13. The virtual painting system of claim 8, wherein at least one of paint color and spray parameters of the electronic device is set in the data processing unit and are used when calculating the video data.

14. The virtual painting system of claim 13, wherein the data processing unit is designed to calculate the video data from the three-dimensional spatial position of the electronic device, a position in the plurality of positions of the trigger of the electronic device, and settings for paint color and spray parameters.

15. The virtual painting system of claim 8, wherein reference data records are kept in the data processing unit, which comprise reference video data for different sets of spray parameters of the electronic device, these reference data records having been recorded by actual paint application processes, wherein the actual paint application processes include physically applying real paint to at least one physical item to be painted, while maintaining the spray parameters and saved in a memory of the data processing unit.

16. The virtual painting system of claim 15 wherein the video data is calculated by comparison and interpolation of at least one of detected spray parameters detected during the virtual paint application process presettings stored within the data processing unit against the reference data records kept in the data processing unit.

17. A paint spray device for use in a virtual painting system, the paint spray device comprising:
   a spray nozzle;
   a position detector mechanically coupled to the paint spray device, wherein the position detector is adapted to detect a three-dimensional spatial position of the paint spray device with respect to a surface to be painted;
   a trigger adapted to start and stop a simulated flow of virtual paint from the paint spray device in the virtual painting system and for controlling a simulated flow rate of the virtual paint from the paint spray device, wherein the trigger is adapted to move from a first position to a second position and a plurality of positions there between, wherein each of the first position, second position, and plurality of positions is associated with a separate and distinct flow rate;
   a trigger indicator mechanically coupled to the trigger, wherein the trigger indicator determines a current position of the trigger;
   at least one transmitter adapted to transmit data associated with the three-dimensional spatial position of the paint spray device and data associated with the current position of the trigger to a data processing unit for visualizing a paint application process based on at least the three-dimensional spatial position of the paint spray device and dynamically adjusting a flow rate associated with the current position of the trigger; and
   a setting selector adapted to set at least one spray parameter at the paint spray device for use in the virtual painting system, wherein the at least one spray parameter includes an air pressure parameter that indicates an amount of air pressure to be simulated by the virtual painting system, wherein the amount air pressure corresponds to an amount of physical air pressure used in a physical paint spray device that forces paint within the physical paint spray device out of a spray nozzle on the physical paint spray device,
   wherein visualization of the paint application process is based on reference data records that comprise reference video data for different sets of spray parameters of the paint spray device, these reference data records having been recorded by actual paint application processes, wherein the actual paint application processes include physically applying real paint using the physical paint spray device to a surface of at least one physical item and recording parameters associated with a paint spraying device including at least distance and speed as the paint spraying device is applying real paint to the at least one physical item and recording parameters associated with applying the real paint using a set of different spray settings on the physical paint spray device.

18. The paint spray device of claim 17, further comprising:
   at least one electronic position detector adapted to detect spray parameters of a three-dimensional spatial position, a distance, and a speed of the electronic device with respect to the virtual surface being painted along with air pressure.

19. The paint spray device of claim 17, further comprising:
   a paint selector adapted to set a paint material for virtually applying a selected paint material to on a surface to be painted in the virtual painting system.

20. The paint spray device of claim 17, wherein the setting selector is adapted to set at least two spray parameters at the paint spray device for use in the virtual painting system.

* * * * *